United States Patent
Kobayashi et al.

(10) Patent No.: US 7,332,056 B2
(45) Date of Patent: Feb. 19, 2008

(54) THIN FILM REMOVING DEVICE AND THIN FILM REMOVING METHOD

(75) Inventors: Shinji Kobayashi, Kikuyo-Machi (JP); Norihisa Koga, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 10/841,548

(22) Filed: May 10, 2004

(65) Prior Publication Data
US 2004/0226916 A1 Nov. 18, 2004

(30) Foreign Application Priority Data
May 14, 2003 (JP) ............... 2003-136411

(51) Int. Cl.
*H01L 21/302* (2006.01)

(52) U.S. Cl. ............... 156/345.17; 156/345.23; 156/345.51; 156/345.55; 134/113; 134/902

(58) Field of Classification Search ............... None
See application file for complete search history.

(56) References Cited

U.S. PATENT DOCUMENTS

| | | | | |
|---|---|---|---|---|
| 5,384,008 A * | 1/1995 | Sinha et al. | ............... | 438/694 |
| 5,490,881 A * | 2/1996 | Kwasnick | ............... | 118/723 E |
| 5,662,770 A * | 9/1997 | Donohoe | ............... | 438/716 |
| 5,815,762 A * | 9/1998 | Sakai et al. | ............... | 396/611 |
| 5,871,584 A * | 2/1999 | Tateyama et al. | ............... | 118/323 |
| 5,939,139 A * | 8/1999 | Fujimoto | ............... | 427/240 |
| 5,993,552 A | 11/1999 | Tsukamoto et al. | | |
| 6,238,511 B1 * | 5/2001 | Sada et al. | ............... | 156/344 |
| 6,537,373 B1 * | 3/2003 | Kitano et al. | ............... | 118/56 |
| 6,709,174 B2 * | 3/2004 | Yamamoto et al. | ............... | 396/604 |
| 2002/0139482 A1 * | 10/2002 | Yanagisawa et al. | .. | 156/345.51 |
| 2003/0077083 A1 * | 4/2003 | Yamamoto et al. | ............... | 396/611 |
| 2003/0165629 A1 * | 9/2003 | Sakurada | ............... | 427/421 |

FOREIGN PATENT DOCUMENTS

JP 2001-198515 7/2001

* cited by examiner

*Primary Examiner*—Anita K Alanko
(74) *Attorney, Agent, or Firm*—Oblon, Spivak, McClelland, Maier & Neustadt, P.C.

(57) ABSTRACT

A thin film removing device and a thin film removing method are capable of removing straight parts of a thin film formed on a square substrate from corners of the substrate, and of suppressing the formation of mists. An approach stage 20 having flat stage plates 23 capable of being disposed substantially flush with the surface of a substrate M mounted on a support table 22 is positioned close to the substrate M mounted on the support table 22. Removing nozzles 30 jet a solvent toward edge parts of the substrate M and suck a solution produced by dissolving part of the resist in the solvent while the removing nozzles 30 are moved along side edges of the substrate M and the approach stage 20 disposed close to the substrate M. Thus, the removing nozzles 30 jet the solvent uniformly over the edge parts and corners of the substrate M and suck the solution without changing modes of jetting the solvent and sucking the solution. Consequently, straight parts of a thin film formed on the square substrate M can be removed from the corners of the substrate M, and the formation of mists can be suppressed.

8 Claims, 13 Drawing Sheets

THIN FILM REMOVING DEVICE AND THIN FILM REMOVING METHOD

BACKGROUND OF THE INVENTION

1. Field of the Invention

The present invention relates to a thin film removing device and a thin film removing method for removing thin films from glass substrates for photomasks (reticles), flat display panels for flat panel displays (FPDs) and the like.

2. Description of the Related Art

Generally, a photomask fabricating process and a liquid crystal display fabricating process uses the photolithographic technique similar to that applied to semiconductor device fabrication for forming, for example, thin ITO films (indium tin oxide films) and circuit patterns. For example, the photolithographic technique applies a liquid resist to the surface of a substrate by a liquid resist application process to form a resist film on the substrate, exposes the resist film to an image of a circuit pattern by an exposure process, and forms a circuit pattern in the resist film by a developing process.

A spin coating method is widely employed in the liquid resist application process. The spin coating method holds a substrate on a spin chuck placed in a processing vessel, drops a liquid resist prepared by dissolving a photosensitive resin in a solvent on the substrate and rotates the spin chuck holding the substrate at a high rotational speed to form a resist film of a uniform thickness on the substrate by spreading the liquid resist over the surface of the substrate by centrifugal force.

When the resist film is formed by the liquid resist application process employing the spin coating method, there is some possibility that the uniformity of the thickness of the resist film deteriorates with time even if the resist film has the uniform thickness immediately after formation. For example, the liquid resist covering an edge part of the surface of the substrate is caused to rise by the agency of surface tension to increase part of the resist film covering the edge part of the surface of the substrate when centrifugal force disappears due to the stop of the spin chuck. In some cases, the liquid resist dropped on the upper surface of the substrate flows over the edges of the substrate to an edge part of the lower surface of the substrate and forms an unnecessary resist film on the edge part of the lower surface of the substrate.

If the resist film is formed on the edge part of the substrate in an irregular thickness, unnecessary parts of the resist film on the edge part of the substrate cannot be completely removed and remain on the substrate when a circuit pattern or the like formed in the resist film is developed. It is possible that the unnecessary remaining parts of the resist film affect adversely to the following processes or come off in particles during the transportation of the substrate.

Therefore, as mentioned in Patent document 1, namely, JP-A No. 2001-198515 (paragraph numbers 0061 to 0066, 0083 and 0084, FIGS. 3, 4, 6 and 10), the part of the resist film on the edge part of the substrate is removed by a thin film removing device called an edge remover. The thin film removing device has a thin film removing head, namely, a thin film removing means, to remove a part of the resist film from an edge part of the substrate. The thin film removing head moves along the edges of the substrate, jets a mixture of a solvent and a pressurized inert gas, such as nitrogen gas ($N_2$ gas) to dissolve parts of the resist film on edge parts of the substrate in the solvent and to remove the parts of the resist film in a resist solution, and sucks the resist solution.

When carrying out the conventional thin film removing method, however, the mixture of the pressurized gas and the solvent spreads at the corners of the substrate in a range wider than that in which the pressurized gas spreads at the sides of the substrate, changing the flow of the pressurized gas for spraying the solvent and condition for sucking the resist solution. Consequently, the mixture cannot be jetted linearly, mists are formed, and corners of the resist film bulge in protrusions. Since a low suction acts on the corners of the resist film, mists formed around the corners cannot be satisfactorily sucked.

SUMMARY OF THE INVENTION

The present invention has been made in view of the foregoing circumstances and it is therefore an object of the present invention to provide a thin film removing device and a thin film removing method capable of removing straight parts of a thin film formed on a square substrate, from edge parts and corners of the substrate, and of suppressing the formation of mists.

A thin film removing device according to the present invention for removing unnecessary parts of a thin liquid film formed on a surface of a square substrate from edge parts of the surface of the substrate by jetting a solvent against the edge parts of the surface of the substrate includes: a support table on which the substrate is mounted; an approach stage disposed near edges of the substrate mounted on the support table, and having flat approach parts having surfaces capable of being extended substantially flush with the surface of the substrate; thin film removing means capable of jetting a solvent toward edge parts of the substrate mounted on the support table and of sucking a solution produced by dissolving part of the thin liquid film in the solvent; and a thin film removing means moving mechanism for moving the thin film removing means along edges of the substrate and the flat approach parts of the approach stage adjacent to edges of the substrate.

The thin film removing device according to the present invention may further include a substrate holding means for transferring a substrate to and receiving the same from the support table, capable of moving vertically and of turning through at least an angle of 90° in a horizontal plane.

In the thin film removing device according to the present invention, the approach stage may be of any type provided that the approach stage can be disposed near the edges of the substrate mounted on the support table and has flat approach parts having surfaces capable of being extended substantially flush with the surface of the substrate. For example, the approach stage may be provided with walls respectively rising up from the flat approach parts so as to define narrow spaces together with the thin film removing means.

In the thin film removing device according to the present invention, at least the surfaces of the flat approach parts of the approach stage may be coated with a water-repellent film, or each of the flat approach parts may be provided with small holes, and the small holes may be connected to a suction pipe.

The thin film removing device according to the present invention may further include an approach stage moving mechanism capable of moving the approach stage toward and away from the support table, width measuring means for measuring the width of the substrate mounted on the support table, and a control means for controlling the approach stage moving mechanism on the basis of signal provided by the width measuring means.

A thin film removing method according to the present invention is intended to remove unnecessary parts of a thin liquid film formed on a surface of a square substrate from edge parts of the surface of the substrate by jetting a solvent against the edge part of the surface of the substrate.

A thin film removing method according to the present invention includes the steps of: mounting a substrate on a support table; positioning an approach stage having flat approach parts with the flat approach parts positioned close to edges of the substrate mounted on the support table and surfaces of the flat approach parts extending substantially flush with a surface of the substrate mounted on the support table; and jetting a solvent toward edge parts of the substrate mounted on the support table and sucking a solution produced by dissolving part of the thin film in the solvent by thin film removing means while the thin film removing means is moved along end edges of the substrate.

A thin film removing method according to the present invention includes the steps of: mounting a substrate on a support table; measuring width of the substrate by moving width measuring means from a position corresponding to one side of the substrate mounted on the support table to a position corresponding to the other side of the same; moving an approach stage having flat approach parts, and capable of being positioned with surfaces of the flat approach parts substantially flush with the surface of the substrate mounted on the support table, on the basis of a width signal provided by the width measuring means to a position close to the edges of the substrate mounted on the support table; and removing unnecessary parts of a thin film formed on the substrate from edge parts of the substrate by moving thin film removing means capable of jetting a solvent toward the edge parts of the substrate mounted on the support table and of sucking a solution produced by dissolving part of the thin film in the solvent along edges of the substrate and the approach stage.

A thin film removing method according to the present invention includes: a first substrate mounting step of mounting a substrate on a support table; a first width measuring step of measuring width of the substrate mounted on the support table by moving width measuring means from a position corresponding to one side of the substrate to a position corresponding to the other side of the same; a first approach stage positioning step of positioning an approach stage having flat approach parts respectively having surfaces capable of being extended substantially flush with the surface of the substrate such that the flat approach parts are positioned respectively close to edges of the substrate on the basis of a signal provided by the width measuring means; a first thin film removing step of jetting a solvent toward edge parts of the substrate and sucking a solution produced by dissolving part of the thin film in the solvent by thin film removing means while the thin film removing means is moved along edges of the substrate and the approach stage; a directional position changing step of lifting up the substrate from the support table, turning the substrate through 90° in a horizontal plane to change directional position of the substrate relative to the support table, and mounting the substrate again on the support table; a second width measuring step of measuring width of the substrate mounted on the support table by moving the width measuring means from a position corresponding to one side of the substrate toward a position corresponding to the other side of the same; a second approach stage positioning step of positioning the approach stage having flat approach parts respectively having the surfaces capable of being extended substantially flush with the surface of the substrate such that the flat approach parts are positioned respectively close to edges of the substrate on the basis of a signal provided by the width measuring means; and a second thin film removing step of jetting the solvent toward edge parts of the substrate and sucking the solution by the thin film removing means while the thin film removing means is moved along the edges of the substrate and the approach stage.

According to the present invention, the approach stage having the flat approach parts having the surfaces capable of being extended substantially flush with the surface of the substrate is positioned near the edge parts of the substrate mounted on the support table, and the solvent is jetted toward the edge parts of the substrate mounted on the support table and the solution is sucked by the thin film removing means while the thin film removing means are moved respectively along the edge parts of the substrate and the approach stage positioned near the edge parts of the substrate by the thin film removing means moving mechanism. Thus, the solvent can be uniformly distributed over the sides and the corners of the substrate and the solution can be sucked from a space around the sides and the corners of the substrate by the thin film removing means without changing conditions for jetting the solvent and sucking the solution. Consequently, straight parts of the thin film formed on the square substrate can be removed from the corners of the substrate and the formation of mists can be suppressed.

According to the present invention, the thin film removing device includes the substrate transfer means for transferring the substrate to and receiving the same from the support table, capable of moving vertically and of turning in the angular range of at least 90° in a horizontal plane. The substrate can be lifted up and turned through 90° by the substrate transfer means after removing parts of the thin film from edge parts along the opposite edges of the substrate, and then the substrate is mounted again on the support table to remove parts of the thin film from edge parts along the rest of the sides of the substrate. Thus, parts of the thin film can be removed from the entire edge parts of the substrate. The substrate can be transferred between the vertically movable substrate transfer means and a substrate carrying means for carrying the substrate.

According to the present invention, the approach stage has the walls rising up from the flat approach parts and defining the narrow spaces together with the thin film removing means and thereby the suction of the thin film removing means can be enhanced. Consequently, parts of the thin film can be efficiently removed from the corners f the substrate.

According to the present invention, the water-repellent film formed at least on the surface of the flat approach parts of the approach stage makes the adhesion of the solvent to the flat approach parts of the approach stage difficult. Consequently, formation of particles due to the adhesion of the solvent to the surfaces of the flat approach parts and the separation of the dried solvent from the surfaces of the flat approach parts can be suppressed.

According to the present invention, the approach stage can be positioned as close as possible to the substrate or can be disposed in contact with the substrate by moving the approach stage toward the support table by the approach stage moving mechanism. Thus, changes in the condition of jetting the solvent and that of sucking the solution at the boundary between the substrate and the approach stage can be reduced, and the thin film can be further efficiently removed. Since the width of the substrate mounted on the support table is measured by the width measuring means by moving the thin film removing means from one to the other end of the substrate, and the approach stage moving mechanism is controlled by a control signal provided by the control means on the basis of a signal provided by the width measuring means, the approach stage can be disposed near or can be brought into contact with the substrate in an optimum state, taking into consideration the size of the substrate and dimensional errors in the substrate. Consequently, the thin film can be efficiently removed without being affected by the size of the substrate and dimensional errors in the substrate.

DESCRIPTION OF THE PREFERRED EMBODIMENTS

Preferred embodiments of the present invention will be described with reference to the accompanying drawings. A resist film forming/removing system employing a thin film removing device according to the present invention will be described.

Figure 1:
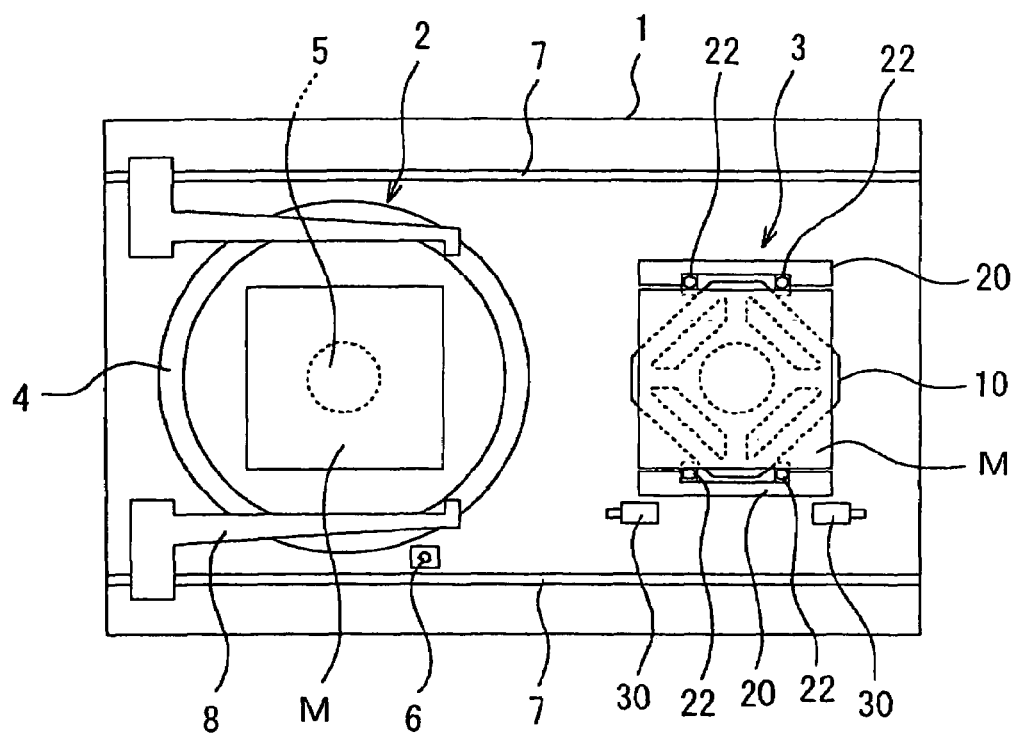
FIG. 1 is a schematic plan view of a resist film forming/removing system employing a thin film removing device according to the present invention.
Figure 2A:
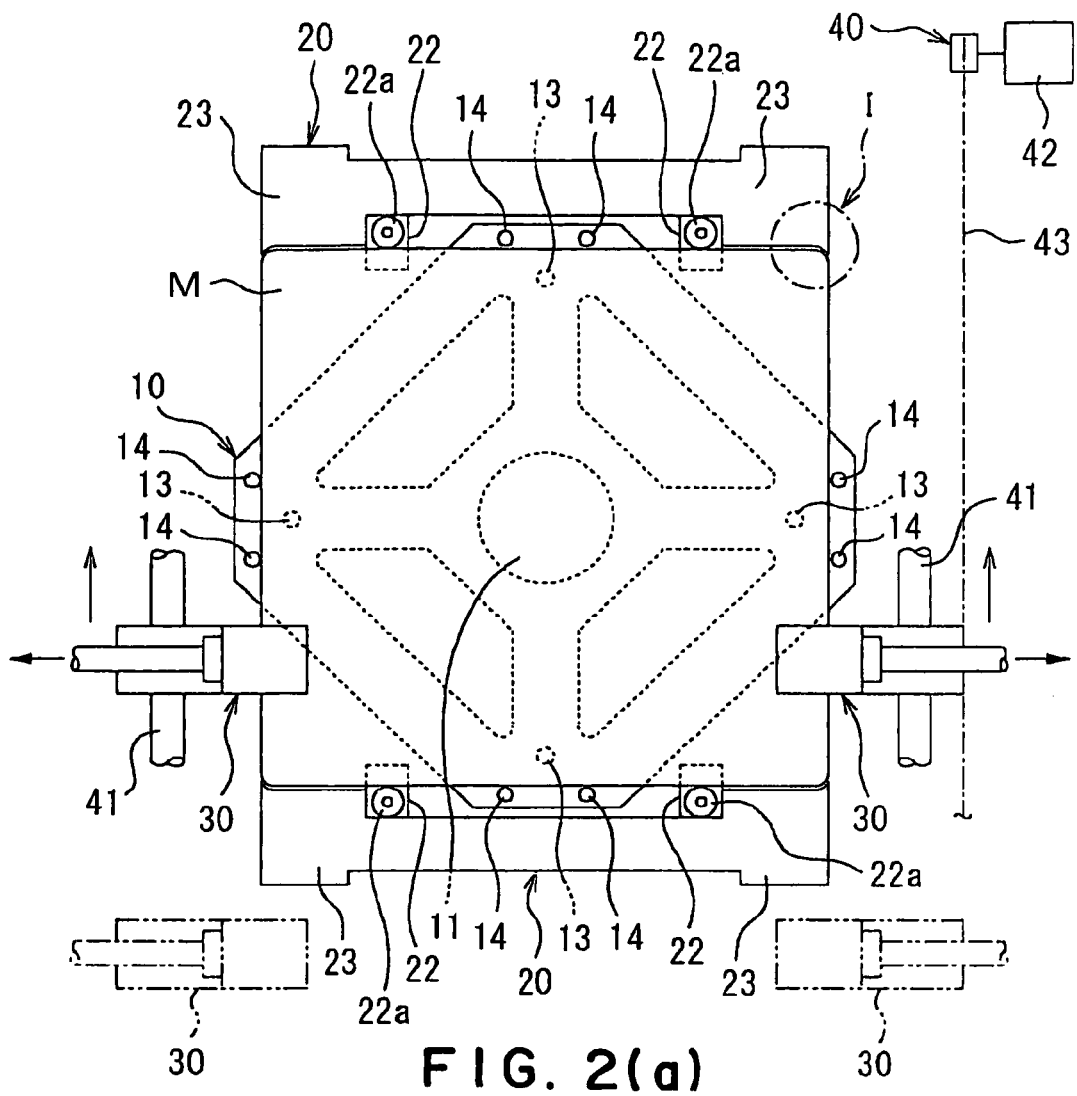
FIG. 2(a) is a schematic plan view of a thin film removing device in a first embodiment according to the present invention.
Figure 2B:
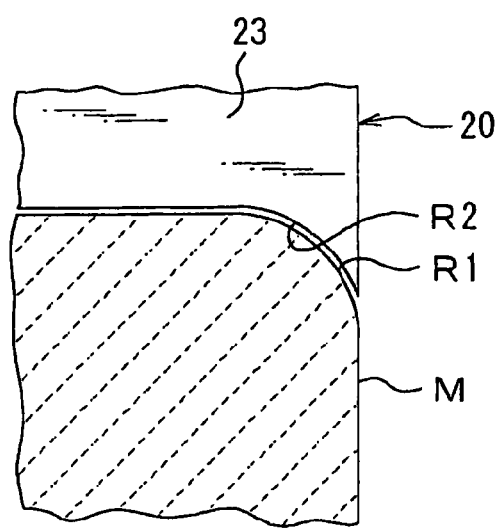
FIG. 2(b) is an enlarged plan view of a part I in FIG. 2(a)
Figure 3:
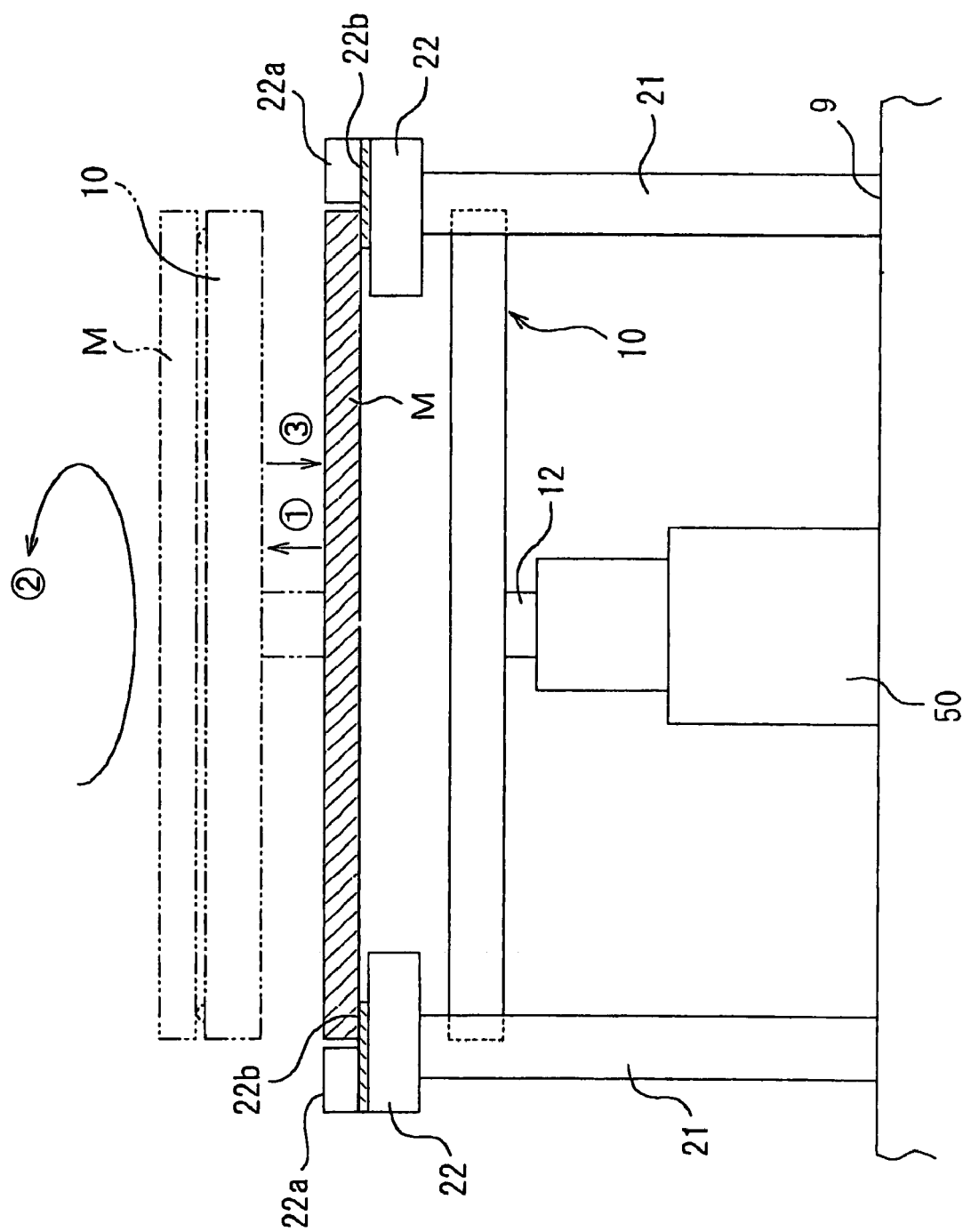
FIG. 3 is a schematic side elevation of the thin film removing device in the first embodiment.

FIG. 1 is a schematic plan view of the resist film forming/removing system, FIG. 2(a) is a schematic plan view of a thin film removing device in a first embodiment according to the present invention, FIG. 2(b) is an enlarged plan view of a part I in FIG. 2(a) and FIG. 3 is a schematic side elevation of the thin film removing device in the first embodiment.

A resist film forming/removing system has a casing 1, a liquid resist application unit 2 placed in the casing 1, and a thin film removing unit 3 placed adjacent to the liquid resist application unit 2 in the casing 1.

The liquid resist application unit 2 includes a rotating cup 4 serving as a processing vessel, a spin chuck 5 for supporting a photomask substrate M (hereinafter, referred to simply as "substrate M") thereon by suction, and a resist-removing nozzle 6 for dropping a liquid resist onto the substrate M from above the center of the substrate M.

The resist nozzle 6 of the liquid resist application unit 2 is moved to a position above the center of the substrate M, the liquid resist is dropped from the resist nozzle 6 onto the substrate M, and then the spin chuck 5 is rotated at a high rotational speed to spread the liquid resist over the substrate M by centrifugal force. Thus, a thin liquid resist film of a uniform thickness is formed over the entire surface of the substrate M. Such a technique for applying the liquid resist to the substrate M while the substrate is rotating is applied also to a process of forming a circuit pattern on a semiconductor wafer. It is difficult to form a uniform liquid resist film on the substrate M because the substrate M is square (rectangular), while the semiconductor wafer is circular. Since the four corners of the substrate M are distant from the center of the substrate, the four corners evolve at a considerably high circumferential speed. Therefore, it is possible that adverse turbulent air currents are generated around the four corners of the substrate M. The volatilization of a solvent contained in the liquid resist must be suppressed to the least possible extent and the liquid resist must be constantly spread to spread the liquid resist uniformly to the corners of the substrate M. In this liquid resist application unit 2, the substrate M is sealed in the rotating cup 4, and is rotated together with the rotating cup 4 to prevent the volatilization of the solvent and the generation of turbulent air currents.

The substrate M thus coated with a liquid resist film is carried by a pair of carrying arms 8, namely, substrate carrying means, capable of moving along guide rails 7 to the thin film removing unit 3.

The thin film removing unit 3 has a support table 22 for supporting the substrate M thereon, a chuck 10, namely, a substrate transfer means for transferring the substrate M to and receiving the same from the support table 22, an approach stage 20 disposed near opposite sides of the substrate M mounted on the support table 22, resist-removing nozzles 30 (hereinafter, referred to simply as "removing nozzles 30"), namely, thin film removing means, and a nozzle moving mechanism 40 for moving the removing nozzles 30.

Figure 6:
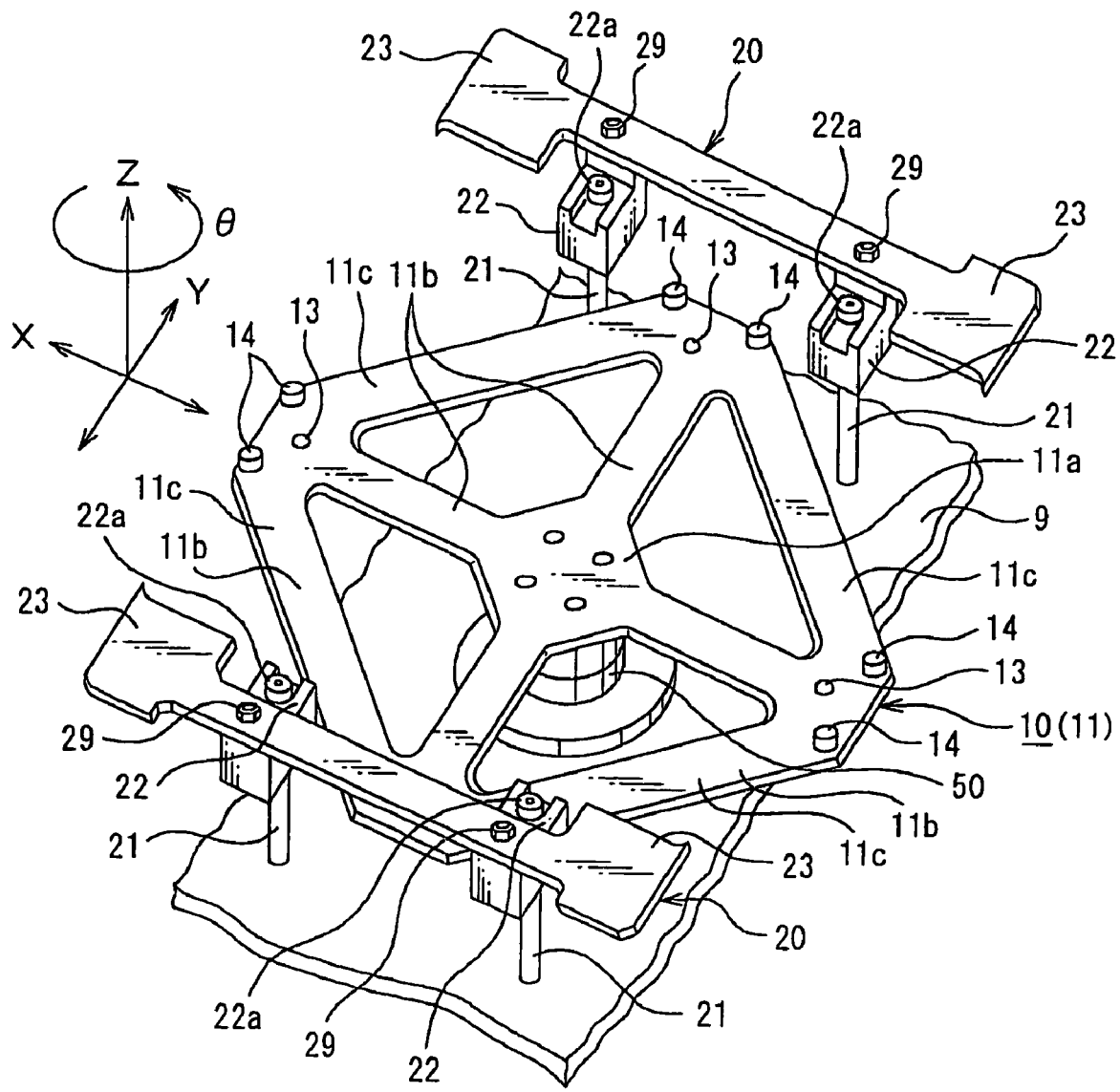
FIG. 6 is a perspective view of a chuck and the approach stage according to the present invention.

Referring to FIGS. 3 and 6, the chuck 10 has a chuck body 11 for supporting the substrate M thereon, a support shaft 12 supporting the chuck body 11, and a chuck operating mechanism 50 interlocked with the support shaft 12. The chuck operating mechanism 50 moves the chuck body 11 vertically, i.e., along the Z-axis, and turns the chuck body 11 in a horizontal plane, i.e., an XY-plane. The chuck body 11 has a rectangular hub 11b joined to the upper end of the support shaft 12 and having the shape of a flat plate, four arms 11b radially extending from the corners of the hub 11a and having the shape of a flat strip, and frame members 11c extending between the outer ends of the adjacent arms 11*b*, respectively, and having the shape of a flat strip. The joints of the frame members 11*c* are beveled. Four support pins 13 are attached to the four beveled corners of the chuck body 11 to support the substrate M with a narrow space formed between the upper surface of the chuck body 11 and the substrate M. Four pairs of holding pins 14 (eight holding pins 14) are attached to the four beveled corners of the chuck body 11.

Referring to FIGS. 2, 3, 5 and 6, the approach stage 20 has two flat approach plates 23 set in a horizontal position on holding member 22 attached to upper ends of four support rods 21 set upright on a base 9, and fastened to the holding members 22 with bolts 29. Each of the holding members 22 is provided with a positioning pin 22*a* that comes into contact with a side of the substrate M, and a proximity seat 22*b* for supporting the substrate M such that a narrow space of, for example, 0.2 mm is formed between the upper surface of the support table 22 and the substrate M (FIG. 3).

The substantially rectangular flat approach plates 23 of the approach stage 20 have upper surfaces substantially flush with the upper surface of the substrate M mounted on the support table 22. The flat approach plates 23 are adjacent to the sides of the substrate M. The end surfaces of the flat approach plates. 23 are flush with the end surfaces f the substrate M, respectively. Gaps between the approach stage 20 and the substrate M are 1.0 mm or below. As shown in FIG. 2(*b*), opposite end parts of the inner edge of each of the flat approach plates 23 are concavely curved in a round edge R2 complementary to a convexly curved round edge R1 of a rounded corner of the substrate M so that a gap of the same size as that between the side of the substrate M and a straight middle part of the flat approach plate 23. Preferably, at least the surface of each flat approach plate 23 of the approach stage 20 is coated with a water-repellent film 24 (FIG. 7(*b*)). The water-repellent films 24 formed on the surfaces of the flag approach plates 23 make it difficult for a solvent, such as a thinner, used for removing a thin film (resist film) to adhere to the approach stage 20, and prevent the formation of particles due to the adhesion of the solvent to the surfaces of the flat approach plates and the separation of the dried solvent from the surfaces of the flat approach plates. The approach stage 20 has a width equal to or greater than the width of a space between the removing nozzles 30.

Figure 4A:
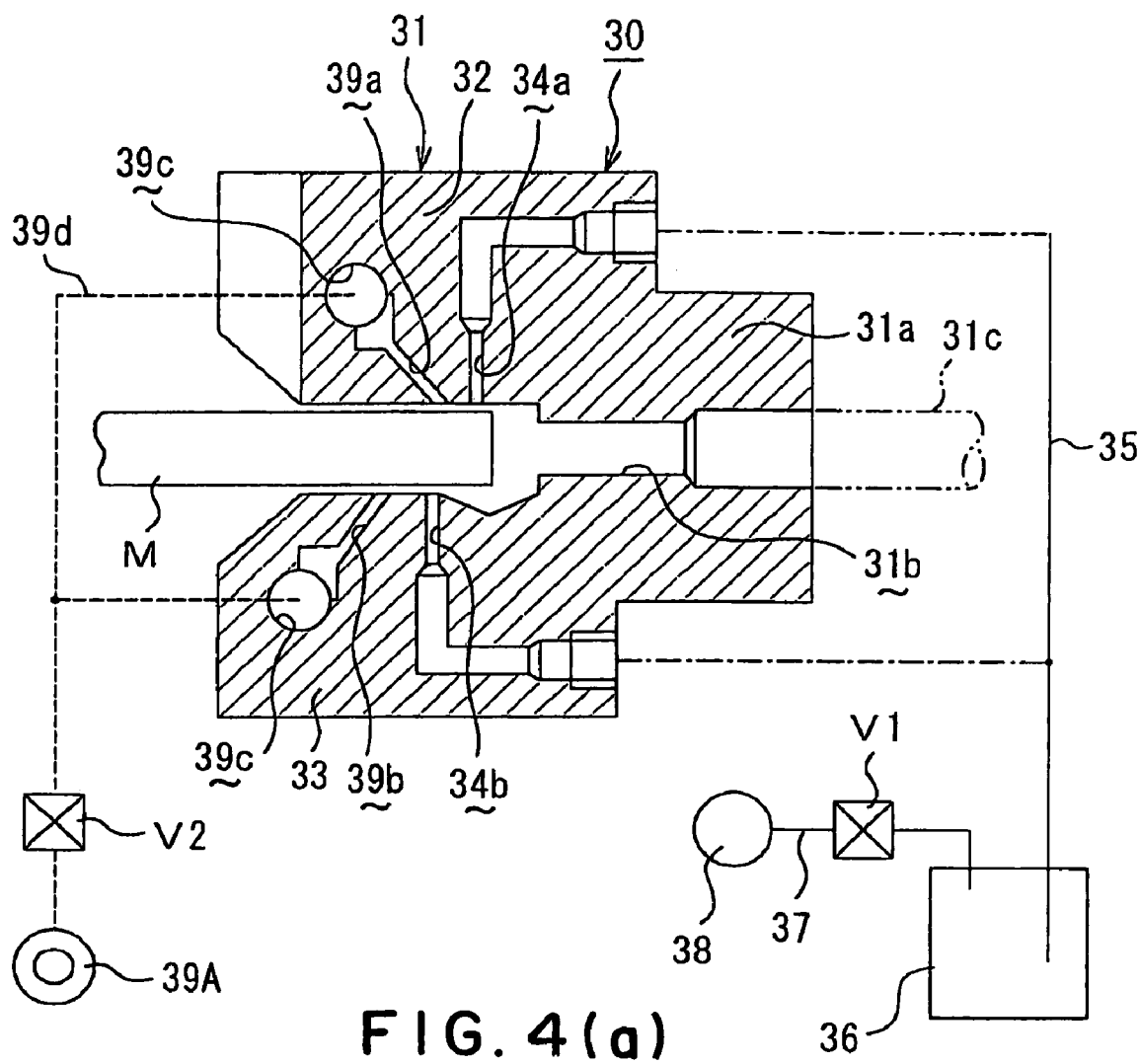
FIG. 4(a) is a sectional view of a resist removing nozzle according to the present invention.
Figure 4B:
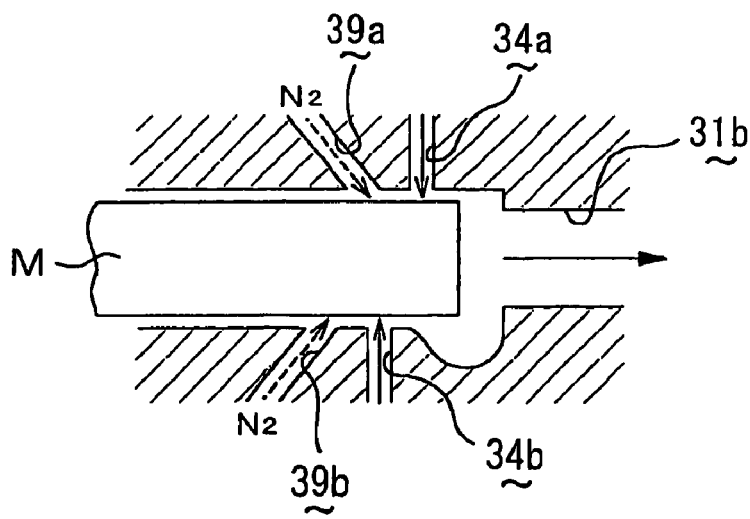
FIG. 4(b) is an enlarged sectional view of a part II in FIG. 4(a)

Referring to FIG. 4, each of the removing nozzles 30 has a nozzle head 31 of a substantially U-shaped cross section provided with a groove defined by an upper wall 32 and a lower wall 33 to receive an edge part of the substrate M. When the edge part of the substrate M is received in the groove of the nozzle head 31, gaps of a thickness of, for example, 1 mm are formed between the upper surface of the substrate M and the inner side surface of the upper wall 32, and between the lower surface of the substrate M and the inner surface of the lower wall 33, respectively. The nozzle head 31 is provided with solvent jetting holes 34*a* and 34*b* formed in the upper wall 32 and the lower wall 33, respectively. A solvent, such as a thinner, is jetted through the solvent jetting holes 34*a* and 34*b* toward the upper and the lower surface of the substrate M. The respective positions of the nozzle holes 34*a* and 34*b* are determined so that the solvent jetting holes 34*a* and 34*b* may not interfere with each other. The nozzle holes 34*a* and 34*b* are connected to a solvent tank 36 by a solvent supply pipe 35. A compressed gas source 38 is connected through a valve V1 to the solvent tank 36 by a gas supply pipe 37 to supply a compressed gas, such as compressed nitrogen gas, into the solvent tank 36. The solvent contained in the solvent tank 36 is supplied by pressure to the solvent jetting holes 34*a* and 34*b* by the pressure of the compressed gas. The solvent may be supplied to the solvent jetting holes 34*a* and 34*b* by a pump instead of by the compressed gas, such as compressed nitrogen gas.

The upper wall 32 and the lower wall 33 of the nozzle head 31 are provided with inert gas jetting holes 39*a* and 39*b*, respectively, and an inert gas passage 39*c* connected to the inert gas jetting holes 39*a* and 39*b*. The inert gas jetting holes 39*a* and 39*b* are inclined so that an inert gas jetted through the inert gas jetting holes 39*a* and 39*b* may flow radially outward along the upper and the lower surface of the substrate M. An inert gas source 39A is connected through a valve V2 to the inert gas passage 39*c* by an inert gas supply pipe 39*d*.

The upper wall 32 and the lower wall 33 of the removing nozzle 30 are connected by a side wall 31*a*. The side wall 31*a* is provided with a suction hole 31*b*. An exhaust pipe 31*c* has one end connected to the suction hole 31*b* and the other end connected to an exhaust device, not shown.

Each removing nozzle 30 is slidably mounted on a guide rail 41 extended parallel to the sides of the chuck 10 and the support table 22 on the outer side of the support table 22. The removing nozzle 30 is moved from one to the other end of the side of the substrate M mounted on the support table 22 by a nozzle moving mechanism 40 including, for example, a stepping motor 42 and a timing belt 43. The nozzle moving mechanism 40 may be, for example, a ball screw mechanism or a cylinder actuator.

The solvent is jetted toward edge parts of the substrate M through the solvent jetting holes 34*a* and 34*b*, and the inert gas is jetted through the inert gas jetting holes 39*a* and 39*b* so that the inert gas flows radially outward along the upper and the lower surface of the substrate as the removing nozzles 30 are moved along the opposite sides of the substrate M. Thus, parts of the resist film, formed on the edge parts of the substrate M are dissolved and removed. Since a suction is produced in the suction holes 31*b* by the exhaust device, the solvent used for dissolving the parts of the thin film and a solution produced by dissolving the parts of the thin film in the solvent are sucked through the suction holes 31*b* and are exhausted outside.

Figure 9:
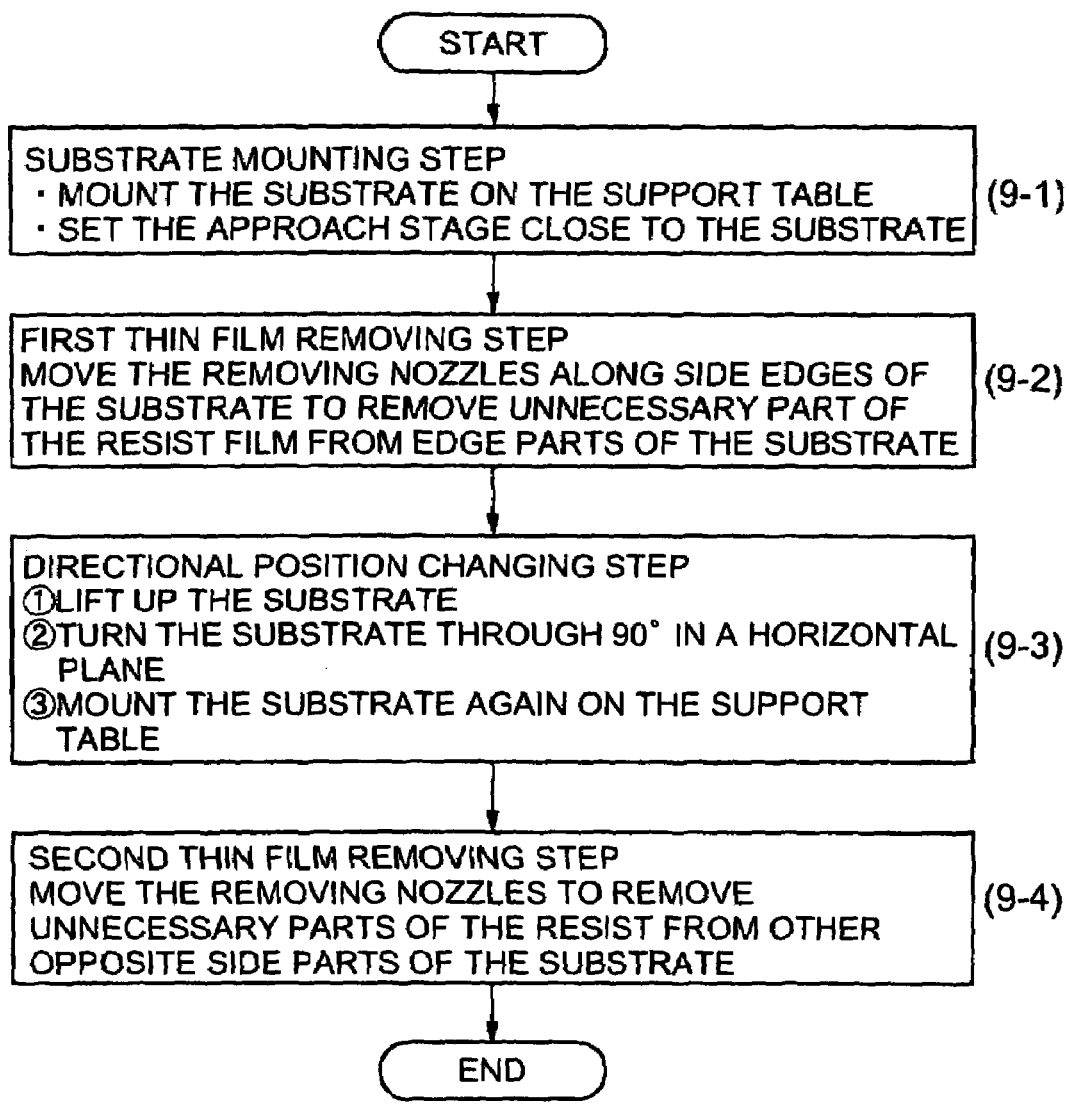
FIG. 9 is a flow chart of a thin film removing method according to the present invention to be carried out by the thin film removing device in the first embodiment.

A resist-removing procedure for removing unnecessary parts of a resist film from edge parts of a substrate M will be described with reference FIG. 3 and a flow chart shown in FIG. 9. A liquid resist film is formed on a substrate M by the liquid resist application unit 2. The carrying arms 8 carry the substrate M coated with the liquid resist film to the thin film removing unit 3, the chuck 10 is raised to receive the substrate M from the carrying arms 8. Then, the carrying arms 8 are retracted from the thin film removing unit 3. In step 9-1, the chuck 10 is lowered to mount the substrate M on the support table 22 such that the substrate M is adjacent to the flat approach plates 23. In step 9-2, the removing nozzles 30 jetting the solvent and the inert gas and sucking gases around the removing nozzles 30 are moved continuously from one of the flat approach plates 23 on one side of the substrate M to one end of the substrate M, along opposite side edge parts of the substrate M, respectively, and from the other end of the substrate M to the other flat approach plate 23 for a resist-removing process. Thus, parts of the resist film are removed simultaneously from the opposite side edge parts of the substrate M. Splash of the solvent by the flat approach plate 23 on the starting side from which the removing nozzles 30 are started can be prevented. Since the flat approach plates 23 are disposed close to the opposite ends of the substrate M, respectively, the solvent can be uniformly jetted against the side edges and the corners of the substrate M and the solution can be sucked from a space around the side edges and the corners of the substrate M by moving the removing nozzles 30 across the flat approach plates 23 and along the side edges of the substrate M without changing conditions for jetting the solvent and sucking the solution. Consequently, straight parts of the thin film formed on the substrate M can be removed from the corners of the substrate M and the formation of mists can be suppressed.

The removing nozzles 30 are returned to their home positions after the parts of the resist film have been removed from the opposite side edge parts of the substrate M. Then, in step 9-3, the chick operating mechanism 50 raises the chuck 10 to lift up the substrate M from the support table 22 (① in FIG. 3), turns the raised chuck 10 through 90° in a horizontal plane (② in FIG. 3), and lowers the chuck 10 to mount the substrate M again on the support table 22 (③ in FIG. 3). At this stage, the side edge parts of the substrate M from which the parts of the resist film have been removed are positioned close to the flat approach plates 23, respectively. Subsequently, the resist-removing process is executed again in step 9-4; the removing nozzles 30 are moved continuously from one of the flat approach plates 23 on one side of the substrate M to one end of the substrate M, along opposite side edges of the substrate M, respectively, and from the other end of the substrate M to the other flat approach plate 23. Thus, parts of the resist film are removed simultaneously from the other opposite side edge parts of the substrate M. Consequently, straight parts of the thin film formed on the substrate M can be removed from the corners of the substrate M and the formation of mists can be suppressed.

Subsequently, the removing nozzles 30 are returned to the home positions, respectively, and are kept at the home positions for the next cycle of the resist-removing process. Then, the chuck operating mechanism 50 raises the chuck 10, the carrying arms 8 are moved into the thin film removing unit 3, and the thus processed substrate M is transferred from the chuck 10 to the carrying arms 8. Substrates are subjected to the thin film removing process successively, and the foregoing steps are repeated to remove unnecessary parts of resist films from edge parts of the substrates.

Figure 7A:
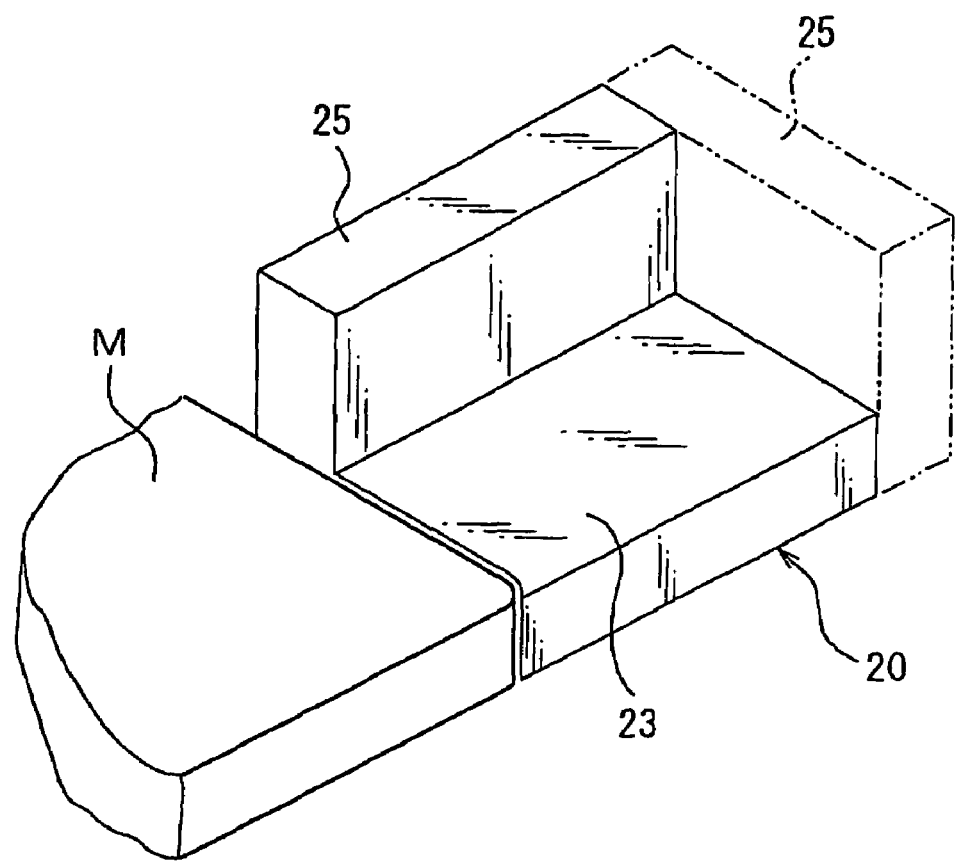
FIG. 7(a) is a perspective view of an approach stage in a modification of the approach stage according to the present invention.
Figure 8A:
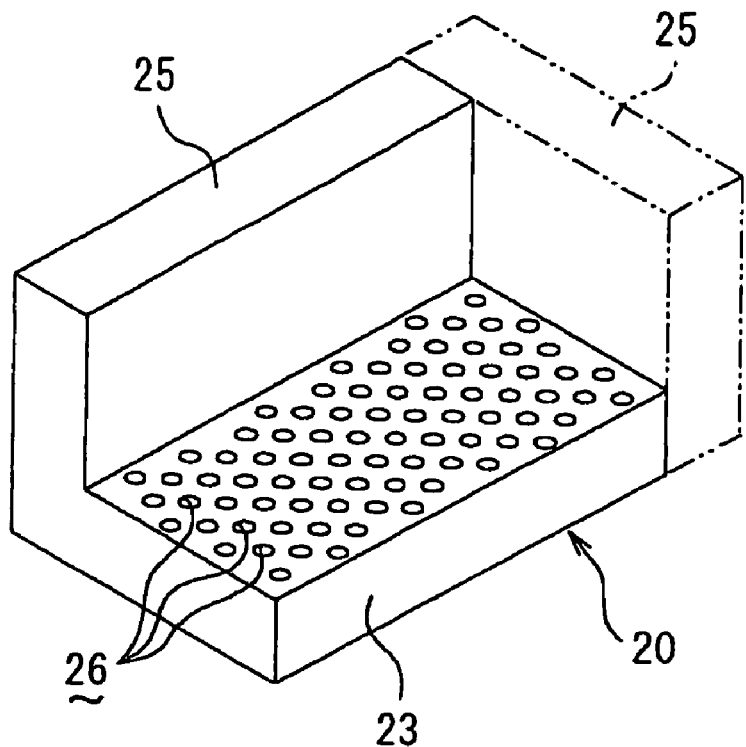
FIG. 8(a) is a perspective view of an approach stage in another modification of the approach stage according to the present invention.

The flat approach plates 23 of this thin film removing unit 3 have the shape of a flat strip. Each of the flat approach plates 23 may be provided with an upright wall 25 on its upper surface as shown in FIGS. 7(a) and 8(a) to form a narrow space between the removing nozzle 30 and the flat approach plate 23. The narrow space formed between the removing nozzle 30 and the wall 25 enhances the suction produced in the suction hole 31b to suck efficiently the solvent used for the thin film removing process, the solution produced by the thin film removing process and mists.

Figure 7B:
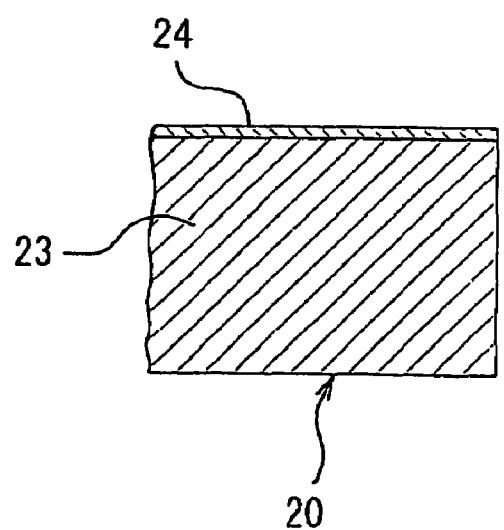
FIG. 7(b) is an enlarged sectional view taken on the line III-III in FIG. 7(a)
Figure 8B:
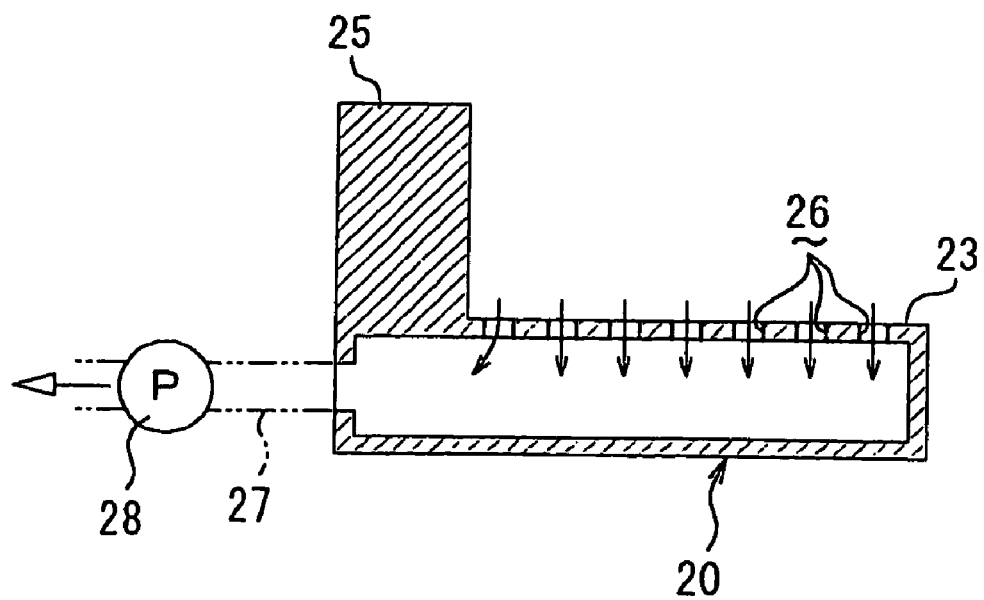
FIG. 8(b) is an enlarged sectional view taken on the line III-III in FIG. 8(a)

The water-repellent film 24 formed at least on the surface of each flat approach plate 23 of the approach stage 20 as shown in FIG. 7 makes it difficult for the solvent used for the thin film removing process and the solution produced by the thin film removing process to adhere to the a thinner, used for removing a thin film (resist film) to adhere to the approach stage 20. Thus, the formation of particles due to the adhesion of the solvent to the surfaces of the flat approach plates 23 and the separation of the dried solvent from the surfaces of the flat approach plates 23 can be suppressed, and the yield can be improved. As shown in FIG. 8(b), each of the flat approach plates 23 of the approach stage 20 may be a hollow structure, small holes 36 of a diameter in the range of about 0.1 to 0.3 mm may be formed in an upper wall of the hollow flat approach plate 23, a cavity formed in the hollow flat approach plate 23 may be connected to an exhaust device, such as a vacuum pump 28 by a suction pipe 27 to remove the solvent and such adhering to the approach stage 20 by suction generated by operating the vacuum pump 28. Thus, the formation of particles due to the separation of the dried solvent from the surfaces of the flat approach plates 23 can be suppressed, and the yield can be improved. The adhesion of the solvent and such to the flat approach plates 23 can be further surely prevented by forming water-repellent films 24 on the walls provided with the small holes 26 of the flat approach plates 23.

Figure 5:
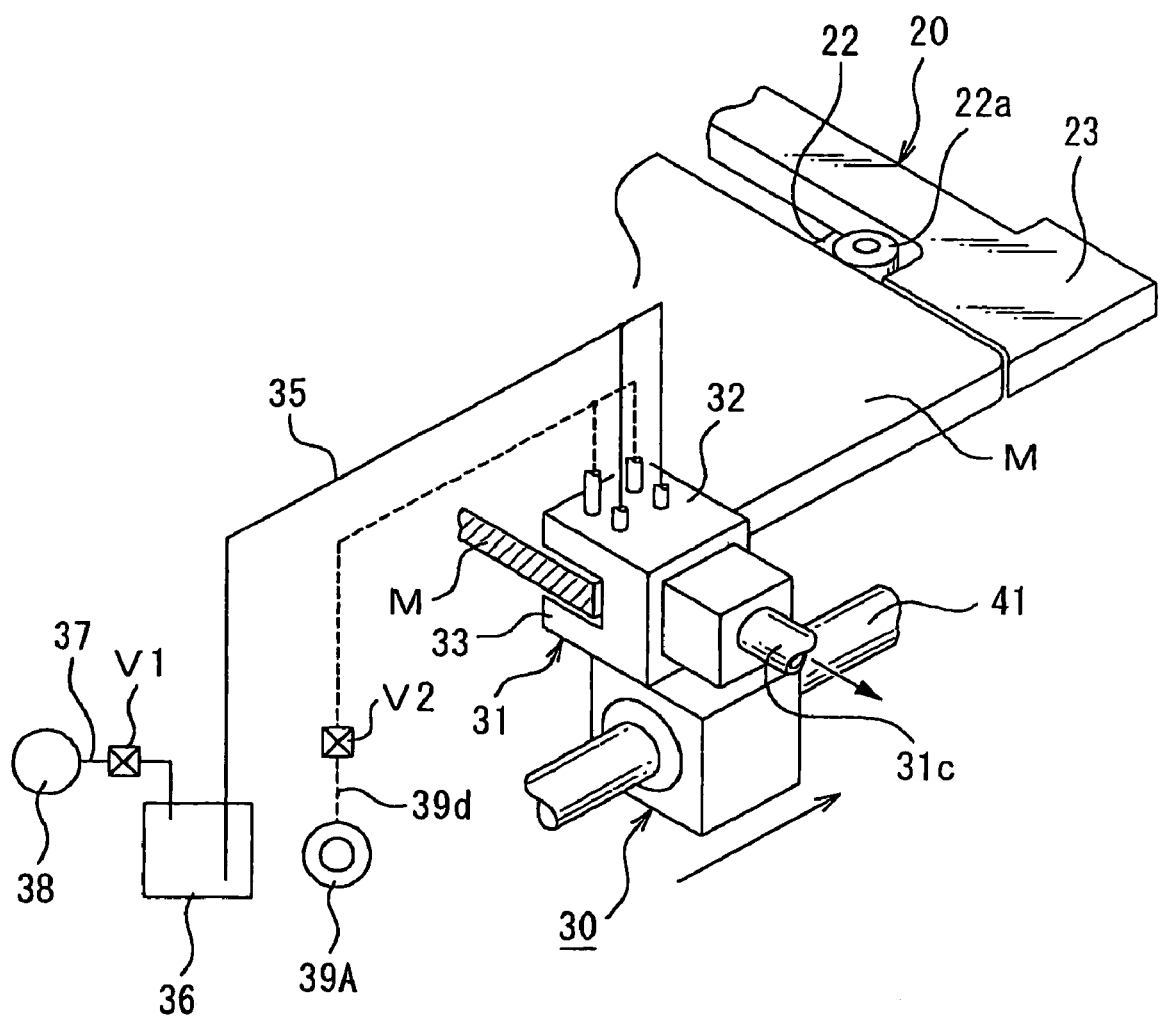
FIG. 5 is a perspective view of the resist removing nozzle and an approach stage according to the present invention.

Removing nozzles and approach stages in modifications of those shown in FIG. 5 will be described with reference to FIGS. 12 and 13.

There are some cases where the solvent and such remain in gaps 100 between the corresponding edges of the flat approach plates 23 and the substrate M. In such a case, it is possible that the solvent and such are splashed over the resist film and erode the resist film. Removing nozzles and approach stages shown in FIGS. 12 and 13 are intended to solve such problems.

First, a thin film removing device in a first modification of the thin film removing device shown in FIG. 2 will be described.

Each of flat approach plates 23 included in the thin film removing device in the first modification is provided in each of opposite end parts thereof with three through holes 102 of, for example, 2 mm in diameter. Each of the through holes 102 has one open end 102a opening in an end surface of the flat approach plate on the side of the removing nozzle 30, and an open end 102b opening in a side surface facing the gap 100 of the flat approach plate 23. The three through holes 102 are straight and parallel to each other.

Figure 12:
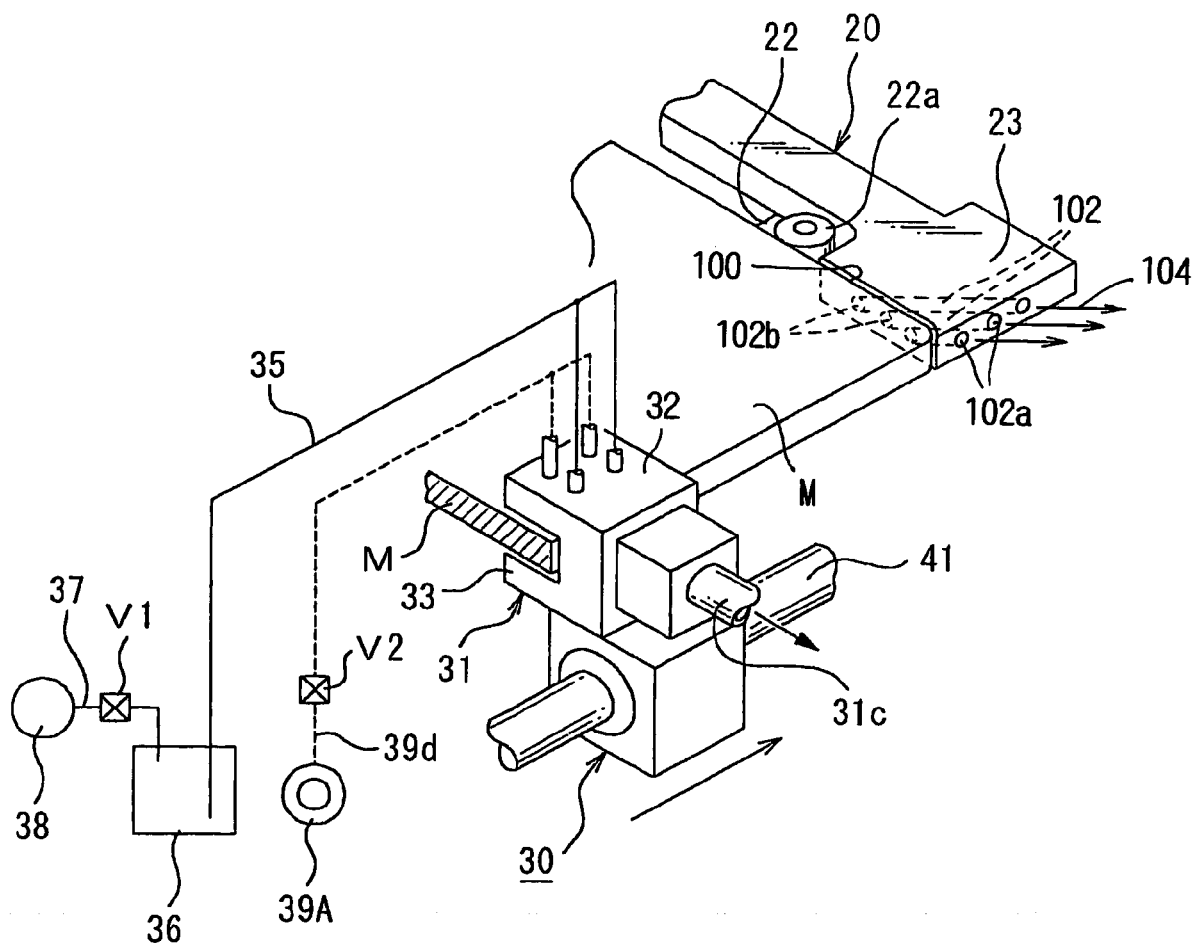
FIG. 12 is a perspective view of a resist-removing nozzle and an approach stage in a first modification of the resist removing nozzle and the approach stage shown in FIG. 5.

In the first modification shown in FIG. 12, the solvent and such remaining in the gap 100 can be sucked through the open ends 102a into the through holes 102 in the direction of the arrows 104, and can be removed through the open ends 102b when the removing nozzles 30 move along the end edges of the flat approach plates 23. Consequently, the adhesion of the solvent and such to the resist film and the erosion of the resist film by the solvent and such can be prevented.

A thin film removing device in a second modification will be described with reference to FIG. 13.

Each of flat approach plates 23 included in the thin film removing device in the second modification is provided in each of opposite end parts thereof with a through hole 106 of, for example, 2 mm in diameter. The through hole 106 has an outer open end 106a opening in the outer side edge perpendicular to the end edge along which the removing nozzle 30 moves, and an inner open end 106b opening in the inner side edge facing the gap 100. The through hole 106 is bent, and has bend, an outer section parallel to the moving direction of the removing nozzle 30 and extending between the outer open end 106a and the bend, and an inner section inclined to the moving direction of the removing nozzle 30 and extending between the bend and the inner open end 106b. A suction pipe 108 has one end connected to the outer open end 106a of the through hole 106 and the other end connected to a suction device.

Figure 13:
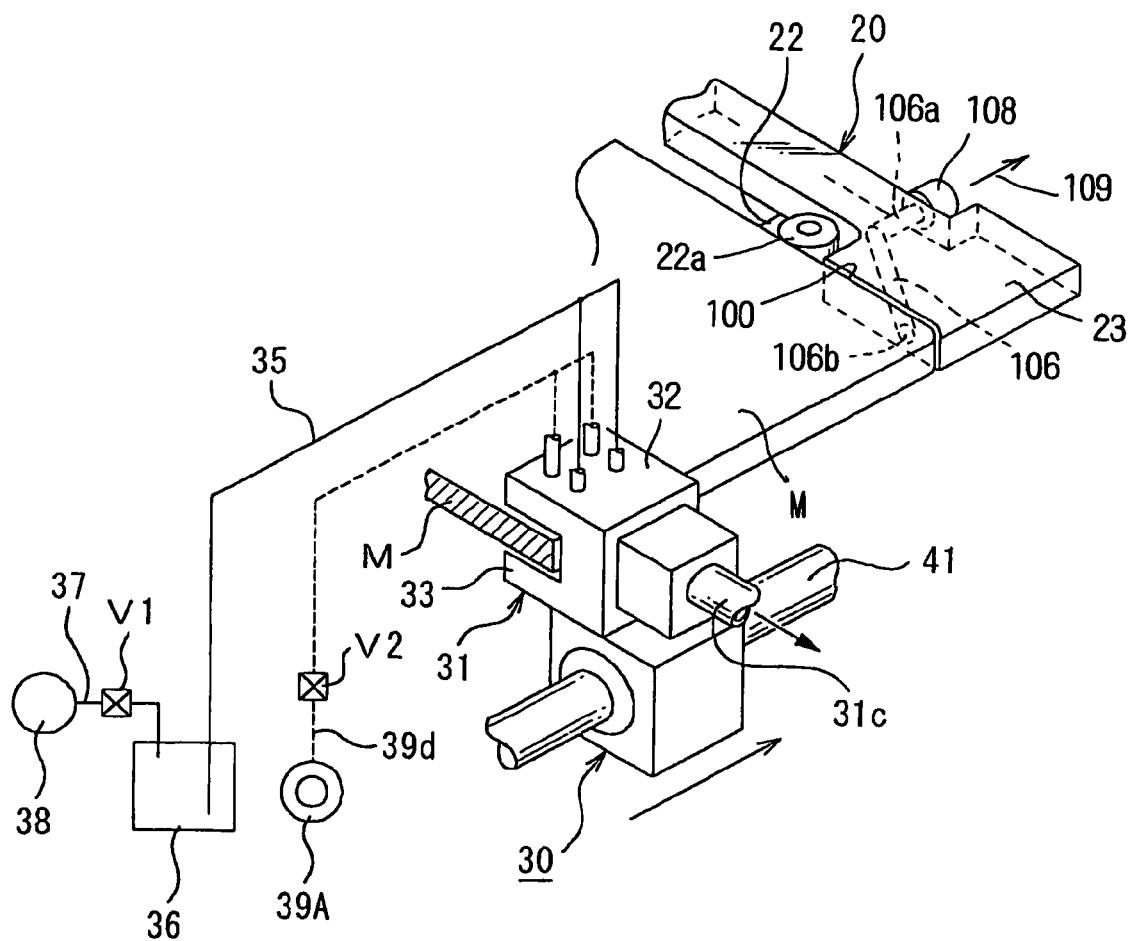
FIG. 13 is a perspective view of a resist removing nozzle and an approach stage in a second modification of the resist-removing nozzle and the approach stage shown in FIG. 5.

In the second modification shown in FIG. 13, the solvent and such remaining in the gap 100 an be sucked into the through holes 106 and can be sucked away through the outer open ends 106a in the direction of the arrow 109 by suction produced by the suction device in the suction pipes 108 connected to the outer open ends 106a. Consequently, the adhesion of the solvent and such to the resist film and the erosion of the resist film by the solvent and such can be prevented.

Figure 10:
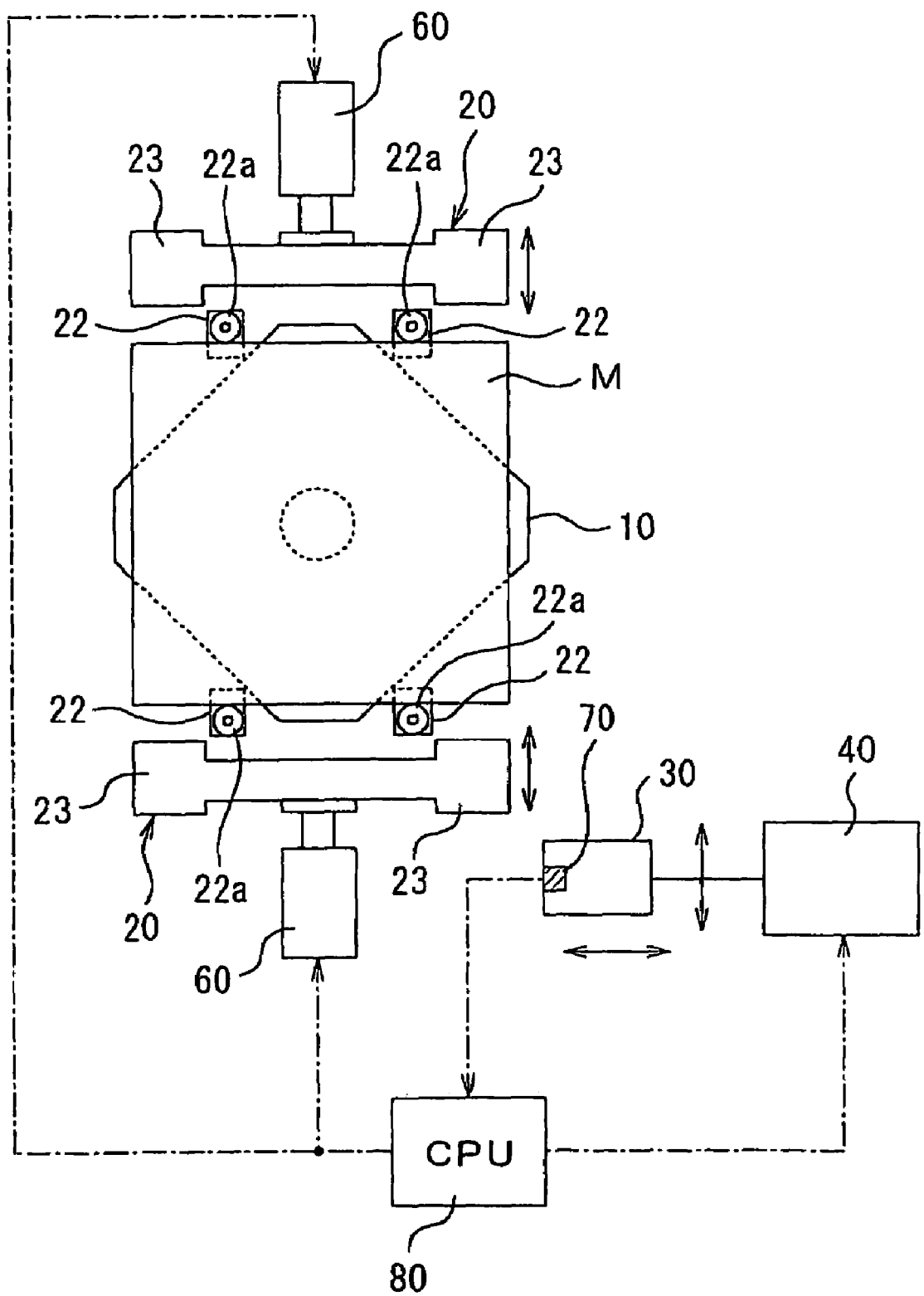
FIG. 10 is a schematic plan view of a thin film removing device in a second embodiment according to the present invention.

FIG. 10 is a schematic plan view of a thin film removing device in a second embodiment according to the present invention.

In the thin film removing device shown in FIG. 10, an approach stage 20 is disposed in an optimum state taking into consideration the size of a substrate M and dimensional errors in the substrate M to improve the efficiency of a resist-removing operation. The approach stage 20 can be moved relative to a support table 22 by an approach stage moving mechanism 60. Each of removing nozzles 30 is provided with a sensor 70 for measuring the width of the substrate M mounted on the support table 22. The removing nozzles 30 are moved for scanning from one to the other end of the substrate mounted on the support table 22 to measure the width of the substrate M. The sensors 70 sends detection signals to a central processing unit 80 (hereinafter, abbreviated to "CPU 80"), namely, control means, the CPU 80 provides a control signal for controlling the approach stage moving mechanism 60 to adjust the position of the approach stage 20 relative to the substrate M according to the width of the substrate M.

The thin film removing device in the second embodiment is identical in other respects to that in the first embodiment and hence parts of the second embodiment like or corresponding to those of the first embodiment are denoted by the same reference characters and the description thereof will be omitted.

Figure 11:
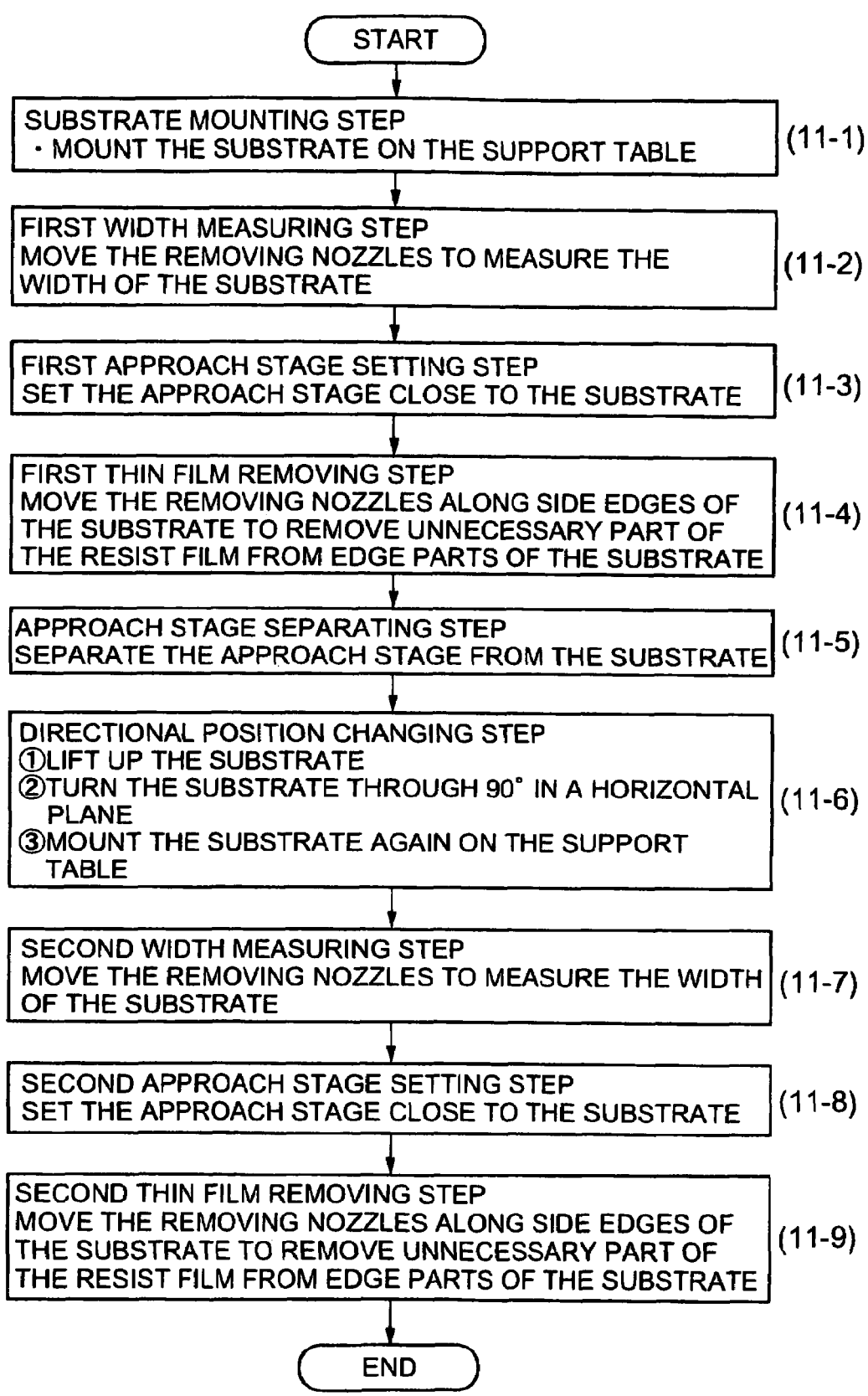
FIG. 11 is a flow chart of a thin film removing method according to the present invention to be carried out by the thin film removing device in the second embodiment.

A resist-removing procedure to be carried out by the second embodiment will be described with reference to FIG. 10 and a flow chart shown in FIG. 11. In step 11-1, the carrying arms 8 carry the substrate M coated with the liquid resist film to the thin film removing unit 3, the chuck 10 receives the substrate M from the carrying arms 8, and the chuck 10 is lowered to mount the substrate M on the support table 22. In step 11-2, the nozzle moving mechanism 40 moves the removing nozzles 30 for scanning from one to the other side of the substrate M to measure the width of the substrate M by the sensors 70, and the sensors 70 send detection signals to the CPU 80. In step 11-3, the CPU 80 provides a control signal to control the approach stage moving mechanism 60 to position the approach state 20 such that the flat approach plates 23 are positioned as close as possible to the side edges of the substrate M or disposed in contact with the side edges of the substrate M.

Then, in step 11-4, the removing nozzles 30 jetting the solvent and the inert gas and sucking gases around the removing nozzles 30 are moved continuously from one of the flat approach plates 23 on one side of the substrate M to one end of the substrate M, along opposite side edges of the substrate M, respectively, and from the other end of the substrate M to the other flat approach plate 23 for a resist-removing process. Thus, unnecessary parts of the resist film are removed from the opposite side edge parts of the substrate M.

Then, in step 11-5, the removing nozzles 30 are returned to their home positions, and the approach stage moving mechanism 60 separates the approach stage 20 from the substrate M. Subsequently, the chuck operating mechanism 50 raises the chuck 10, turns the chuck through 90° in a horizontal plane, and lowers the chuck 10 to mount the substrate M again on the support table 22 in step 11-6. In step 11-7, the nozzle moving mechanism 40 moves the removing nozzles 30 for scanning from one to the other side of the substrate M to measure the width of the substrate M, and the sensors 70 send detection signals to the CPU 80. In step 11-8, the CPU 80 provides a control signal to control the approach stage moving mechanism 60 such that the flat approach plates 23 of the approach stage 20 are positioned as close as possible to the opposite sides of the substrate M or are disposed in contact with the opposite sides of the substrate M.

Subsequently, the removing nozzles 30 are moved continuously from one of the flat approach plates 23 on one side of the substrate M to the other flat approach plate 23 for a resist-removing process in step 11-9. Thus, unnecessary parts of the resist film are removed from the opposite side edge parts of the substrate M.

After the completion of the resist-removing process, the removing nozzles 30 are returned to and kept at their home positions for the next cycle of the resist-removing process. At the same time, the approach stage moving mechanism 60 separates the approach stage 20 from the substrate M, the chuck operating mechanism 50 raises the chuck 10 to transfer the substrate M from the chuck 10 to the carrying arms, not shown, moved into the thin film removing unit 3. Substrates are subjected to the thin film removing process successively, and those steps are repeated to remove unnecessary parts of resist films from edge parts of the substrates.

Although the thin film removing devices of the present invention has been described as applied to the resist film forming/removing system for forming a photomask, the thin film removing devices of the present invention is applicable to removing unnecessary parts of thin films from square or rectangular substrates, such as glass substrates for forming the flat display panels of FPDs and glass substrates for forming the flat display panels of LCDs.

The thin film removing devices according to the present invention have the following effects.

(1) The solvent can be jetted uniformly on the edge parts and the corners of the substrate and the solution can be sucked away by the thin film removing device without changing modes of supplying the solvent and sucking the solution. Thus, straight parts of the thin film formed on the substrate can be removed from the corners of the substrate and the formation of mists can be suppressed.

(2) Parts of the thin film are removed from the opposite edge parts of the substrate, the substrate holding means is raised, is turned through 900 in a horizontal plane, the substrate holding means is lowered, and then parts of the thin film are removed from the other opposite edge parts of the substrate. Thus, parts of the thin film can be removed from all the edge parts of the substrate. Since the vertically movable substrate holding means facilitate transferring the substrate between the substrate holding means and the substrate carrying means.

(3) The suction of the thin film removing means can be enhanced by the walls set upright on the flat approach plates of the approach stage and forming a narrow space together with the thin film removing means, parts of the thin film can be further efficiently removed from the corners of the substrate.

(4) The water repellent film formed at least on the surface of each flat approach plate of the approach stage makes it difficult for the solvent to adhere to each flat approach plate of the approach stage. Thus, formation of particles due to the adhesion of the solvent to the surfaces of the flat approach plates and the separation of the dried solvent from the surfaces of the flat approach plates can be suppressed and thereby the yield can be improved.

(5) Since the solvent and such adhered to the approach stage can be removed through the through holes and the suction pipe, formation of particles due to the adhesion of the solvent to the surfaces of the flat approach plates and the separation of the dried solvent from the surfaces of the flat approach plates can be suppressed and thereby the yield can be improved.

(6) Since the approach stage can be positioned such that the flat approach plates are positioned as close to the edges of the substrate as possible or in contact with the edges of the substrate, changes in modes of supplying the solvent and sucking the solution in the boundaries between the substrate and the approach stage can be reduced, the efficiency of thin film removal can be further enhanced. Since the approach stage can be positioned close to or in contact with the substrate in an optimum state, parts of the thin film can be further efficiently removed without being affected by the size of the substrate and dimensional errors in the substrate.

What is claimed is:

1. A thin film removing device for removing unnecessary parts of a thin film formed on a surface of a substrate having side edges forming a square shape from edge parts of the surface of the substrate by jetting a solvent against the edge parts of the surface of the substrate in a liquid resist application process ahead of an exposure process, said thin film removing device comprising:
   a support table on which the substrate is to be mounted;
   an approach stage configured to be disposed near edges of the substrate mounted on the support table, having flat approach parts having surfaces configured to be disposed adjacent to the substrate and to be extended substantially flush with a surface of the substrate;
   thin film removing means having a nozzle head of a substantially U-shaped cross section to receive an edge part of the substrate, the nozzle head having an upper jetting portion, a lower jetting portion and a sucking portion, the upper jetting portion configured to jet a solvent from one surface side of the substrate toward the edge parts of the substrate mounted on the support table, the lower jetting portion configured to jet a solvent from other surface side of the substrate toward the edge parts of the substrate, and the sucking portion configured to suck a solution produced by dissolving part of the thin film in the solvent; and
   a thin film removing means moving mechanism configured to move the nozzle head having the upper jetting portion, the lower jetting portion and the sucking portion along the side edges of the substrate and the flat approach parts of the approach stage adjacent to the side edges of the substrate so that the thin film removing means jet the solvent toward the edge parts of an entire surface of the substrate.

2. The thin film removing device according to claim 1, further comprising a substrate holding means for transferring a substrate to and receiving the same from the support table, capable of moving vertically and of turning through at least an angle of 90° in a horizontal plane.

3. The thin film removing device according to claim 1, wherein the approach stage is provided with walls respectively rising up from the flat approach parts so as to define narrow spaces together with the thin film removing means.

4. The thin film removing device according to claim 1, wherein at least the surfaces of the flat approach parts of the approach stage are coated with a water-repellent film.

5. The thin film removing device according to claim 1, wherein at least each of the flat approach parts of the approach stage is provided with a plurality of small holes, and the small holes are connected to a suction pipe.

6. The thin film removing device according to claim 1, wherein a gap is formed between an end part of each of the flat approach parts, and each of the flat approach parts is provided in each of opposite end parts thereof with through holes each having one open end opening in an end surface of the flat approach plate on the side of the thin film removing means, and an open end opening in a side surface facing the gap of the flat approach part.

7. The thin film removing device according to claim 1, wherein each of flat approach parts is provided in each of opposite end parts thereof with a through hole having an outer open end opening in an outer side edge perpendicular to an end edge along which the thin film removing means moves, and an inner open end opening in an inner side edge facing the gap.

8. The thin film removing device according to claim 1 further comprising:
   an approach stage moving mechanism configured to move the approach stage toward and away from the support table;
   width measuring means for measuring width of the substrate mounted on the support table; and
   a control means for controlling the approach stage moving mechanism on the basis of signals provided by the width measuring means.

* * * * *